(12) United States Patent
Jang et al.

(10) Patent No.: US 8,367,509 B1
(45) Date of Patent: Feb. 5, 2013

(54) SELF-ALIGNED METHOD FOR FORMING CONTACT OF DEVICE WITH REDUCED STEP HEIGHT

(75) Inventors: Jeng-Hsing Jang, Taoyuan County (TW); Yi-Nan Chen, Taoyuan County (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 1 day.

(21) Appl. No.: 13/239,030

(22) Filed: Sep. 21, 2011

(51) Int. Cl.
  *H01L 21/336* (2006.01)
(52) U.S. Cl. .. 438/303; 438/199; 438/299; 257/E21.632
(58) Field of Classification Search .................. 438/199, 438/230, 299, 303; 257/E21.632
  See application file for complete search history.

(56) References Cited

U.S. PATENT DOCUMENTS 5,863,837 A * 1/1999 Sudo .............................. 438/692

\* cited by examiner

*Primary Examiner* — Thanhha Pham

(57) ABSTRACT

A method for forming a contact of a semiconductor device with reduced step height is disclosed, comprising forming a plurality of gates, forming a buffer layer on each of the gates, forming an insulating layer to fill spaces between the gates, forming strip-shaped photoresist patterns which cross the gates, etching the insulating layer to form first openings using a self-aligning process with the gates and the strip-shaped photoresist patterns as a mask, forming a conductive contact layer to fill the first openings, performing a first chemical mechanical polish (CMP) process to the conductive contact layer, removing the buffer layer, and forming a second chemical mechanical polish (CMP) process to the conductive contact layer.

18 Claims, 17 Drawing Sheets

SELF-ALIGNED METHOD FOR FORMING CONTACT OF DEVICE WITH REDUCED STEP HEIGHT

BACKGROUND OF THE INVENTION

1. Field of the Invention

This invention generally relates to a semiconductor manufacturing process and more particularly to a method for addressing step height issues of a self-alignment process.

2. Description of the Related Art

The semiconductor art has been concerned with reducing the size and power consumption of individual devices and integrated circuits in order to increase the logic power of these circuits per unit area. A particular effort has been made in the area of monolithic random access memories (RAMs) which have very large memory capacities. Many things have been done over the years in an attempt to reduce the size of devices and improve tolerances with which they are fabricated, such as a self-aligned etching process.

A self-alignment process is a simple method for a lithography process. However, self-alignment causes step heights between a poly gate and poly contact. This issue decreases the chemical mechanical polishing (CMP) process window and thus generates bridge issues.

BRIEF SUMMARY OF INVENTION

The invention provides a method for forming a contact of a semiconductor device with reduced step height, comprising: forming a plurality of gates; forming a buffer layer on each of the gates; form an insulating layer to fill spaces between the gates; forming strip-shaped photoresist patterns which cross the gates; etching the insulating layer to form first openings using a self-aligning process with the gates and the strip-shaped photoresist patterns as a mask; forming a conductive contact layer to fill the first openings; performing a first chemical mechanical polish (CMP) process to the conductive contact layer removing the buffer layer; and performing a second chemical mechanical polish (CMP) process to the conductive contact layer.

The invention provides a Method for forming a semiconductor device, comprising forming a plurality of gates; forming a buffer layers on each of the gates; forming an insulating layer to fill spaces between the gates, forming strip-shaped photoresist patterns which cross the gates; etching the insulating layer to form first openings using a self-aligning process with the gates and the strip-shaped photoresist patterns as a mask, wherein portions of the buffer layer under the strip-shaped photoresist patterns are not etched, and the buffer layer uncovered by the strip-shaped photoresist patterns is etched during the a self-aligned etching process, so that portions of the buffer layer covered by the strip-shaped photoresist patterns have a greater thickness than portions of the buffer layer uncovered by the strip-shaped photoresist patterns after etching the insulating layer using a self-aligning process; forming a conductive contact layer to fill the first openings; performing a first chemical mechanical polish (CMP) process to the conductive contact layer, removing the buffer layer, and performing a second chemical mechanical polish (CMP) process to the conductive contact layer, wherein the gate and conductive contact layer substantially have the same height after performing of the second chemical mechanical polish (CMP) process.

BRIEF DESCRIPTION OF DRAWINGS

The invention can be more fully understood by reading the subsequent detailed description and examples with references made to the accompanying drawings, wherein.

DETAILED DESCRIPTION OF INVENTION

It is understood that specific embodiments are provided as examples to teach the broader inventive concept, and one of ordinary skill in the art can easily apply the teaching of the present disclosure to other methods or apparatus. The following discussion is only used to illustrate the invention, not limit the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
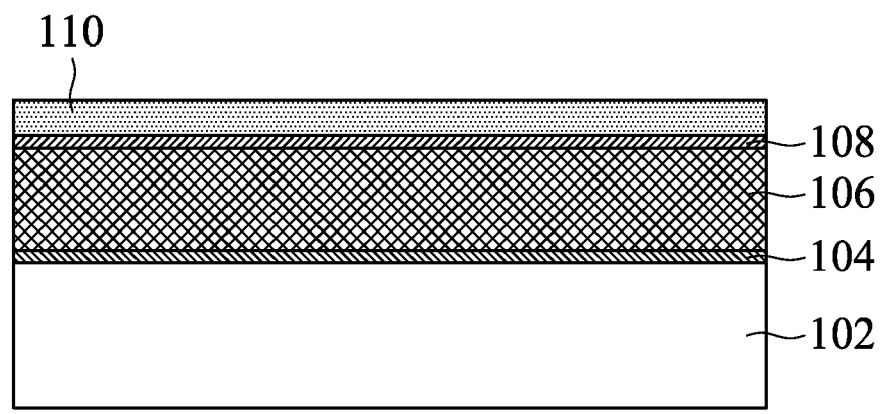
FIG. 1 shows a cross section of a stage of a method for forming a semiconductor device of an embodiment of the invention.
Figure 2:
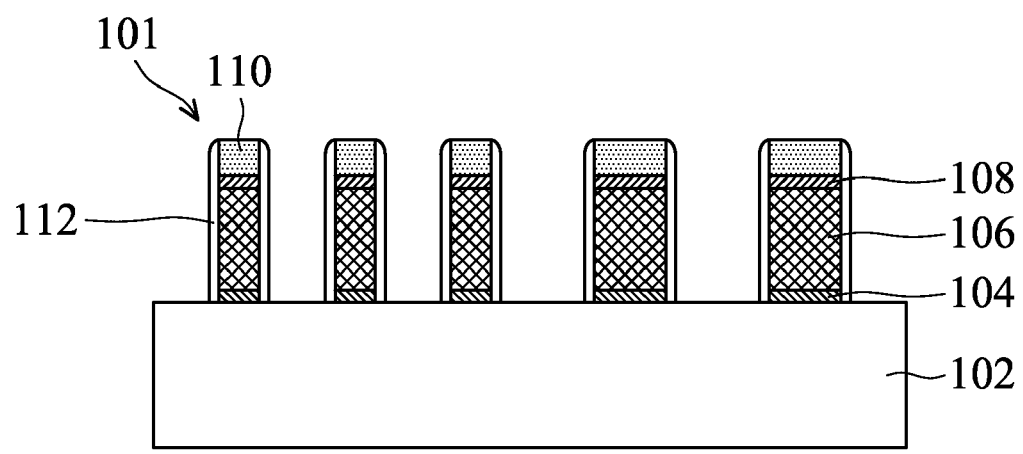
FIG. 2 shows a cross section of a stage of a method for forming a semiconductor device of an embodiment of the invention.
Figure 3:
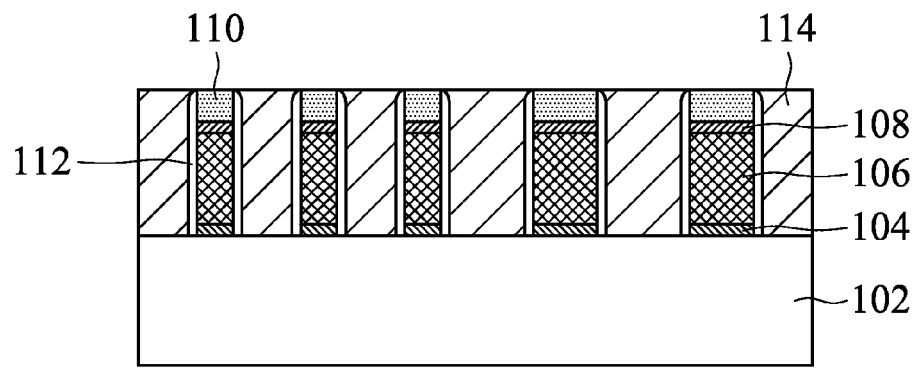
FIG. 3 shows a cross section of a stage of a method for forming a semiconductor device of an embodiment of the invention.
Figure 4A:
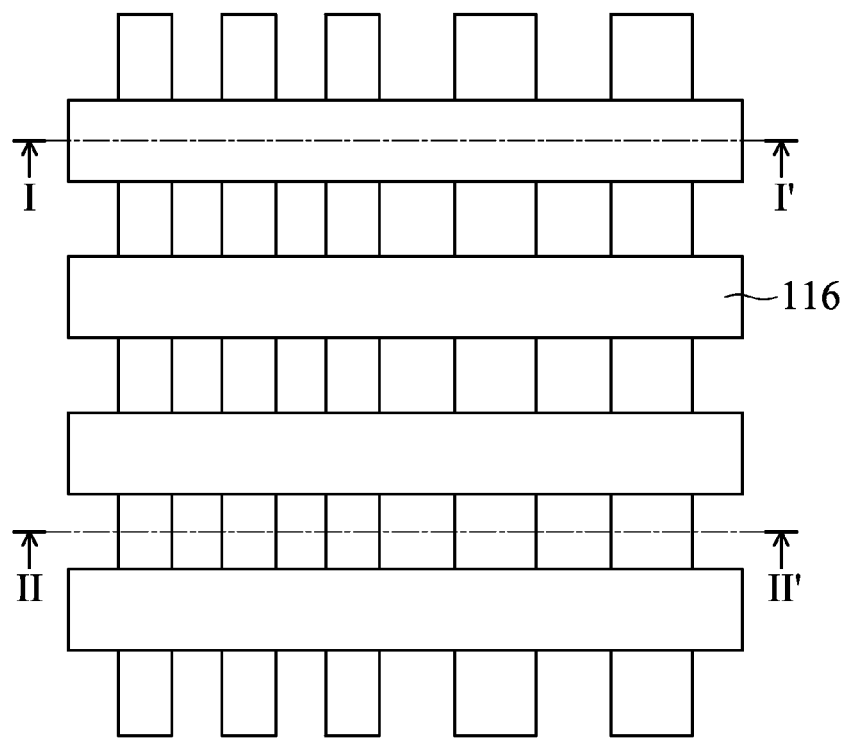
FIG. 4A shows a top view of a stage of a method for forming a semiconductor device of an embodiment of the invention.
Figure 4B:
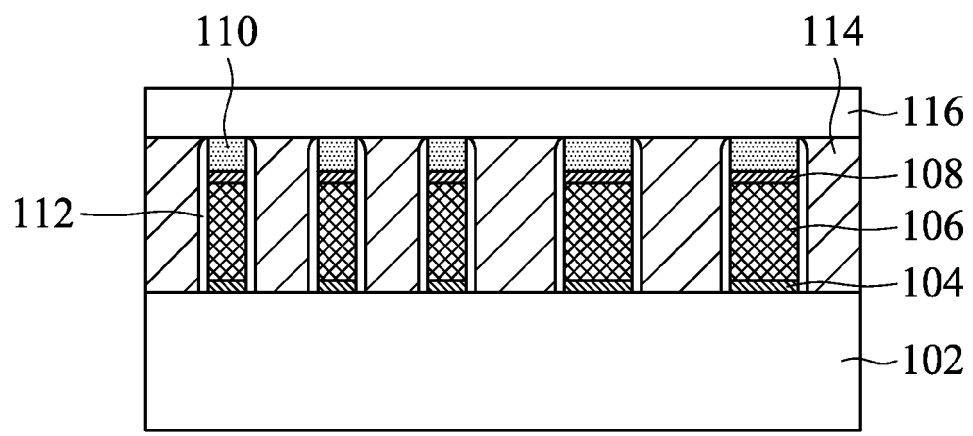
FIG. 4B shows a cross section along line I-I' of FIG. 4A.
Figure 4C:
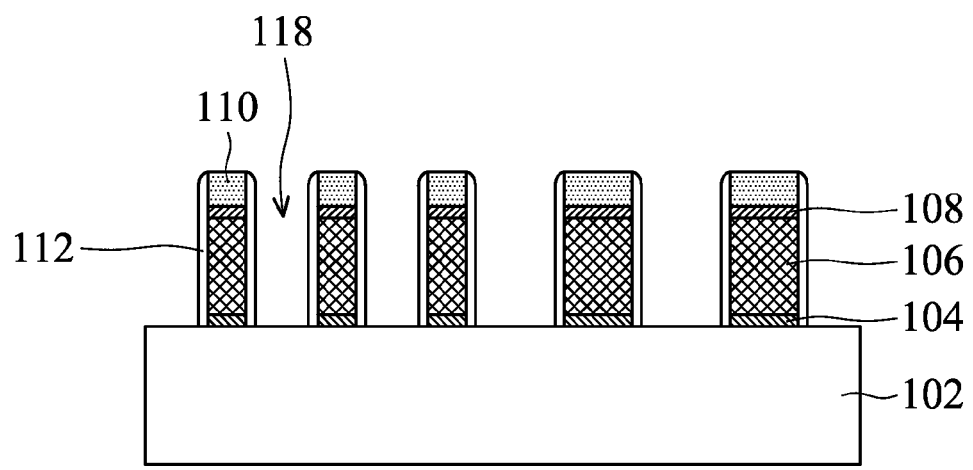
FIG. 4C shows a cross section along line II-II' of FIG. 4A.
Figure 5A:
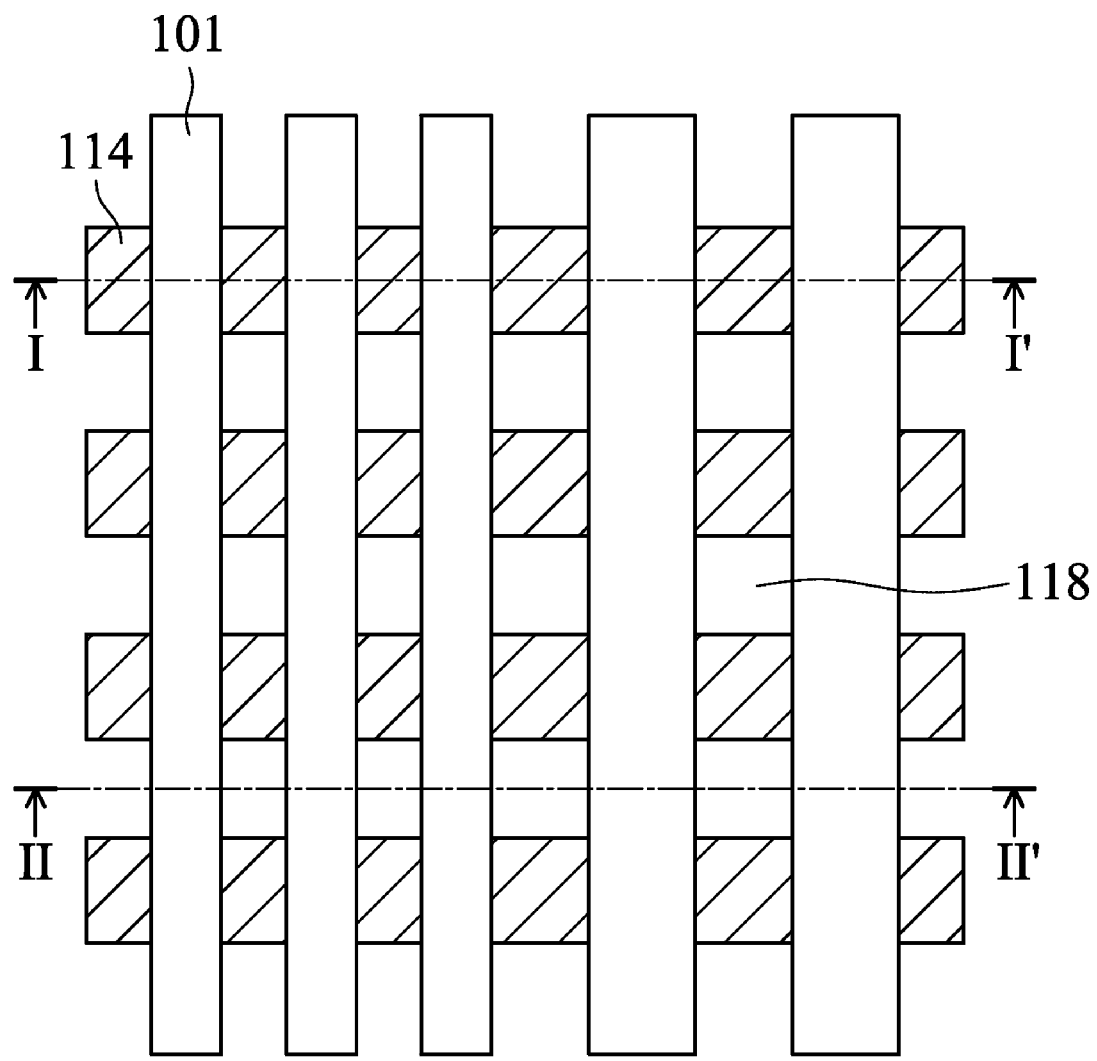
FIG. 5A shows a top view of a stage of a method for forming a semiconductor device of an embodiment of the invention.
Figure 5B:
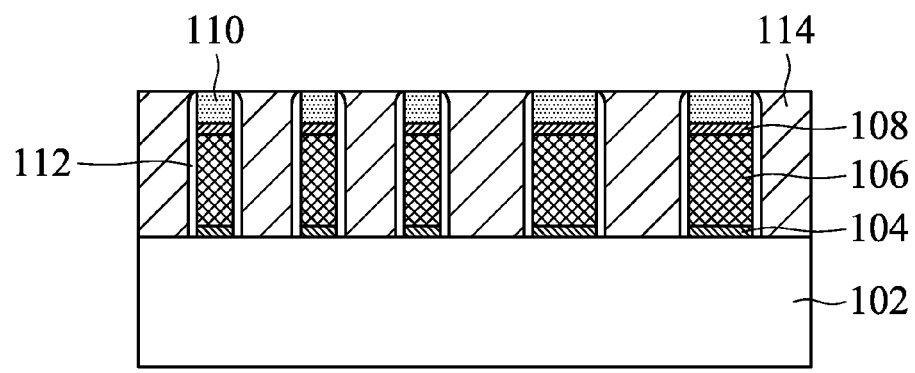
FIG. 5B shows a cross section along line I-I' of FIG. 5A.
Figure 5C:
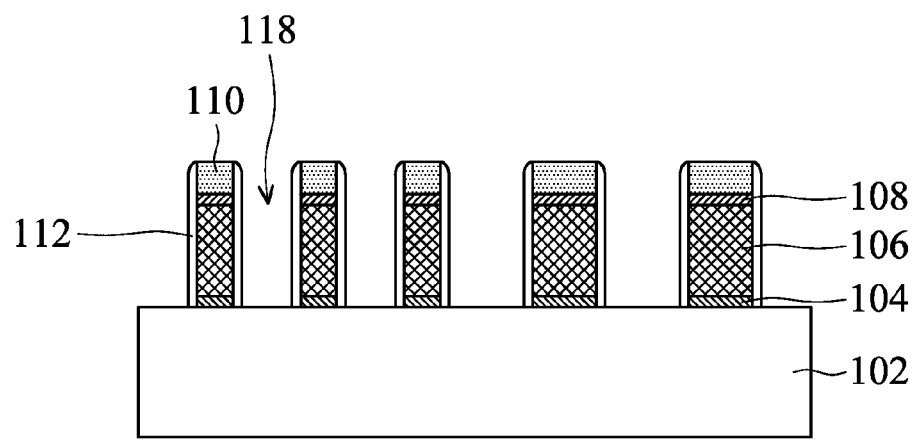
FIG. 5C shows a cross section along line II-II' of FIG. 5A
Figure 6A:
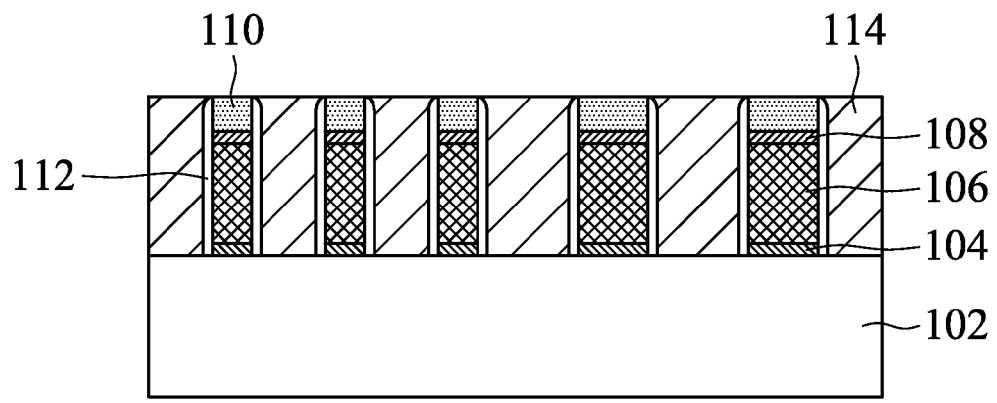
FIG. 6A shows a cross section of a next stage of the step of FIG. 5B.
Figure 6B:
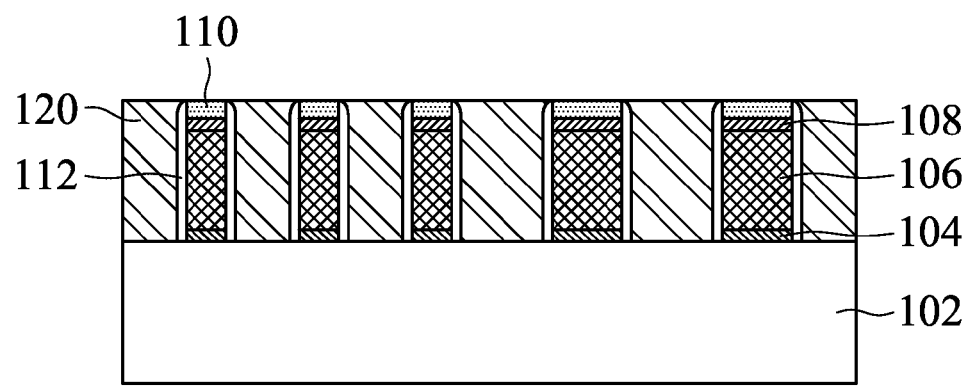
FIG. 6B shows a cross section of a next stage of the step of FIG. 5C.
Figure 7A:
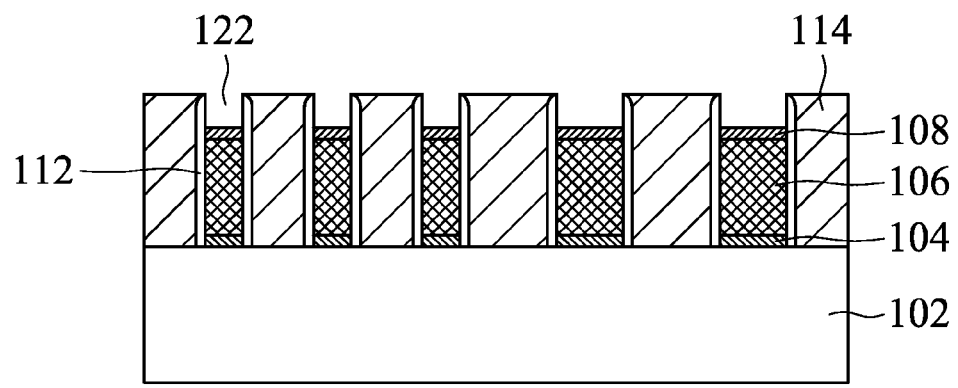
FIG. 7A shows a cross section of a next stage of the step of FIG. 6A.
Figure 7B:
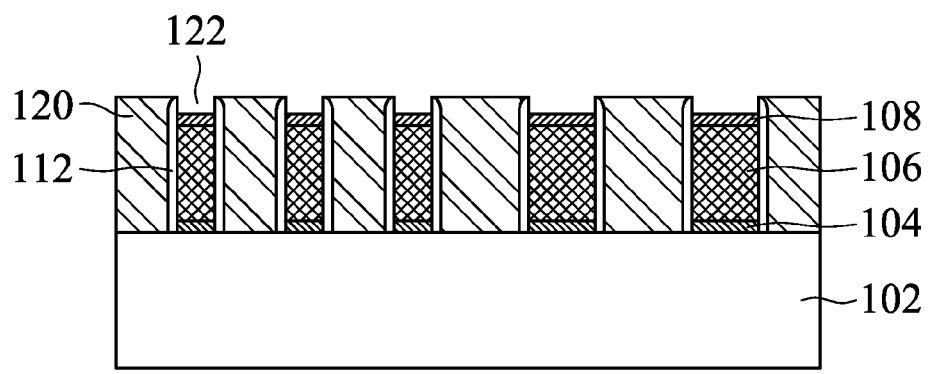
FIG. 7B shows a cross section of a next stage of the step of FIG. 6B.
Figure 8A:
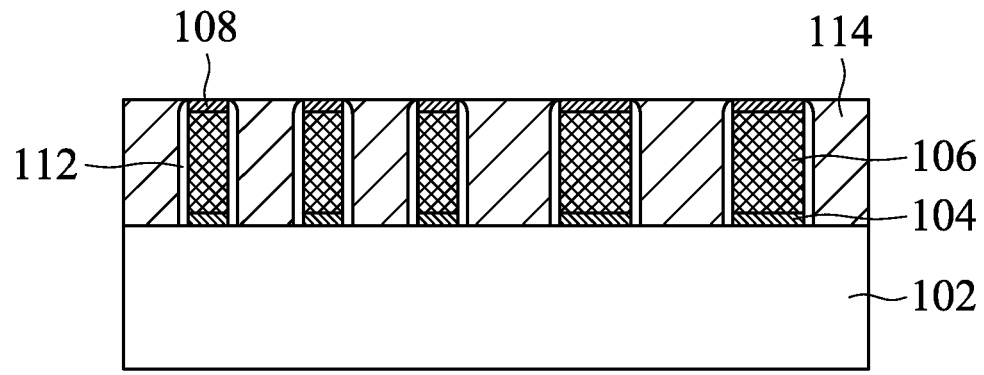
FIG. 8A shows a cross section of a next stage of the step of FIG. 7A.
Figure 8B:
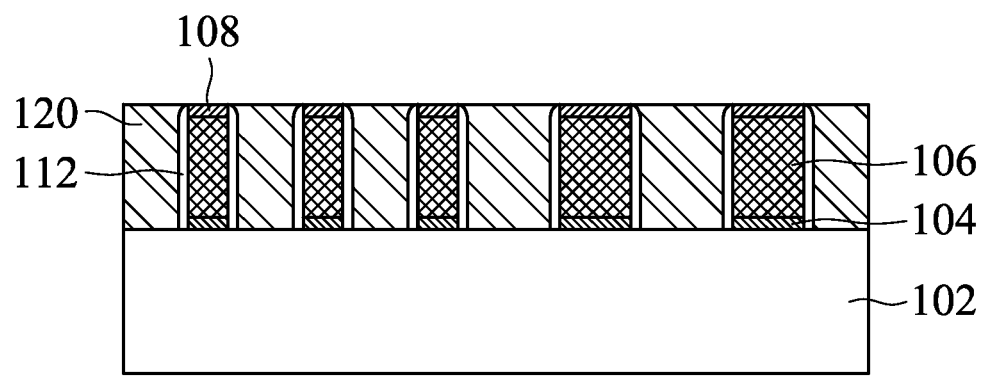
FIG. 8B shows a cross section of a next stage of the step of FIG. 7B.
Figure 9:
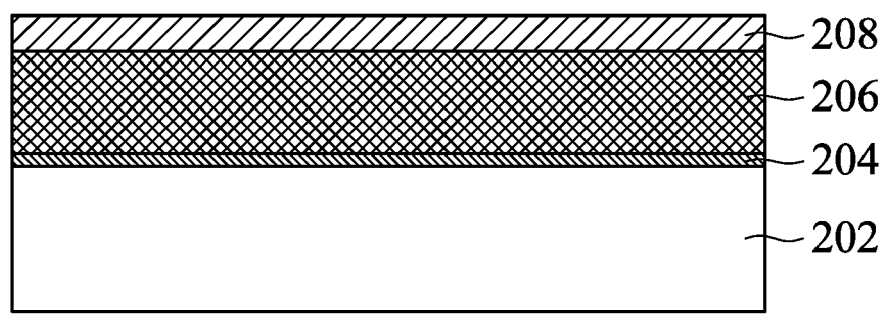
FIG. 9 shows a cross section of a stage of a method for forming a semiconductor device of another embodiment of the invention.

FIG. 1~FIG. 8B show various stages of a method to address step height issues when using a self-alignment method for forming a conductive contact of an embodiment of invention. First, referring to FIG. 1, a substrate 102 is provided. The substrate 102 may comprise silicon, gallium arsenide, gallium nitride, strained silicon, silicon germanium, silicon carbide, diamond, an epitaxy layer, and/or other materials. In a preferred embodiment of the invention, the substrate 102 is formed of silicon. A gate dielectric layer 104 is formed on the substrate 102. The gate dielectric layer 104 may comprise silicon oxide, silicon nitride, silicon oxynitride, or high dielectric constant materials, such as $Ta_2O_5$, $HfO_2$, $HSiO_x$, $Al_2O_3$, $InO_2$, $La_2O_3$, $ZrO_2$, and $TaO_2$. Next, a gate electrode layer 106 is formed on the gate dielectric layer 104. The gate electrode layer 106 can be poly or metal, such as tungsten. A cap layer 108 is formed on the gate electrode layer 106. In an embodiment of the invention, the cap layer 108 can be formed of silicon nitride. Thereafter, a buffer layer 110 is formed on the cap layer 108. In an embodiment of the invention, the buffer layer 110 can be formed of carbon, silicon nitride or silicon oxide. Referring to FIG. 2, the gate dielectric layer 104, the gate electrode layer 106, the cap layer 108 and a dummy are patterned by lithography and etching to form gates 101, wherein each of the gates comprises a gate dielectric layer on a substrate, a gate electrode layer on the gate dielectric layer and a cap layer on the gate electrode layer. The buffer layer 110 is formed on the gates 101 and spacers 112, for example formed of TEOS, and are formed on sidewalls of the gates 101. Referring to FIG. 3, an insulating layer 114 is deposited to fill the space between the gates 101. In an embodiment of the invention, the insulating layer 114 can be BPSG, PSG, or USG. Referring to FIG. 4A, FIG. 4B and FIG. 4C, wherein FIG. 4A shows a top view of a stage of a method for forming a semiconductor device, FIG. 4B shows a cross section along line I-I' of FIG. 4A, and FIG. 4C shows a cross section along line II-II' of FIG. 4A, a lithography process is performed to form a plurality of strip-shaped photoresist patterns 116 on the gates 101 and the insulating layer 114. Thereafter, a self-aligned etching process is performed to etch the insulating layer 114 using the gates 101 and the strip-shaped photoresist patterns 116 as an etching mask to form first openings 118. Next, referring to FIG. 5A, FIG. 5B and FIG. 5C, wherein FIG. 5A shows a top view of a stage of a method for forming a semiconductor device, FIG. 5B shows a cross section along line I-I' of FIG. 5A, and FIG. 5C shows a cross section along line II-II' of FIG. 5A, the strip-shaped photoresist patterns 116 are removed. In an embodiment of the invention, the strip-shaped photoresist patterns 116 can be removed by ashing. It is noted that since a portion of the buffer layer 110 is covered by the strip-shaped photoresist patterns 116 during a self-aligned etching process, the potions of the buffer layer 110 in FIG. 5B have a greater thickness than the potions of the buffer layer 110 in FIG. 5C. However, the gate electrode layer 106 in FIG. 5B substantially has the same thickness as the gate electrode layer 106 in FIG. 5C. That is, portions of the buffer layer 110 under the strip-shaped photoresist patterns 116 are not etched, and the buffer layer 110 uncovered by the strip-shaped photoresist patterns 116 is etched during a self-aligned etching process, so that portions of the buffer layer 110 covered by the strip-shaped photoresist patterns 116 have a greater thickness than portions of the buffer layer 110 uncovered by the strip-shaped photoresist patterns 116. Referring to FIG. 6A, and FIG. 6B, wherein FIG. 6A shows a cross section of a next stage of the step of FIG. 5B, and FIG. 6B shows a cross section of a next stage of the step of FIG. 5C, and a conductive contact layer 120 is deposited to fill the first openings 118. In an embodiment of the invention, the conductive contact layer 120 is polysilicon. Next, the conductive contact layer 120 is polished by a first CMP process to remove portions for a flat surface and exposing the buffer layer 110. Referring to FIG. 7A, and FIG. 7B, wherein FIG. 7A shows a cross section of a next stage of the step of FIG. 6A, and FIG. 7B shows a cross section of a next stage of the step of FIG. 6B, the buffer layer 110 is removed to form second openings 122. In an embodiment when the buffer layer 110 is silicon nitride, a wet etching process, such as immersion in phosphoric acid can remove the buffer layer 110. Referring to FIG. 8A, and FIG. 8B, wherein FIG. 8A shows a cross section of a next stage of the step of FIG. 7A, and FIG. 8B shows a cross section of a next stage of the step of FIG. 7B, a second CMP process is performed for the gate (including the gate dielectric layer 104, the gate electrode layer 106 and the cap layer 108) substantially having the same height as the conductive contact layer 120. As shown in FIG. 8B, a surface of the cap layer 108 and a surface of the conductive contact layer 120 are substantially coplanar after performing of the second chemical mechanical polish (CMP) process. The process of FIG. 1~FIG. 8B can be called a buffer layer 110 first process because the buffer layer 110 is formed prior to chemical mechanical polishing the insulating layer 114.

Figure 10:
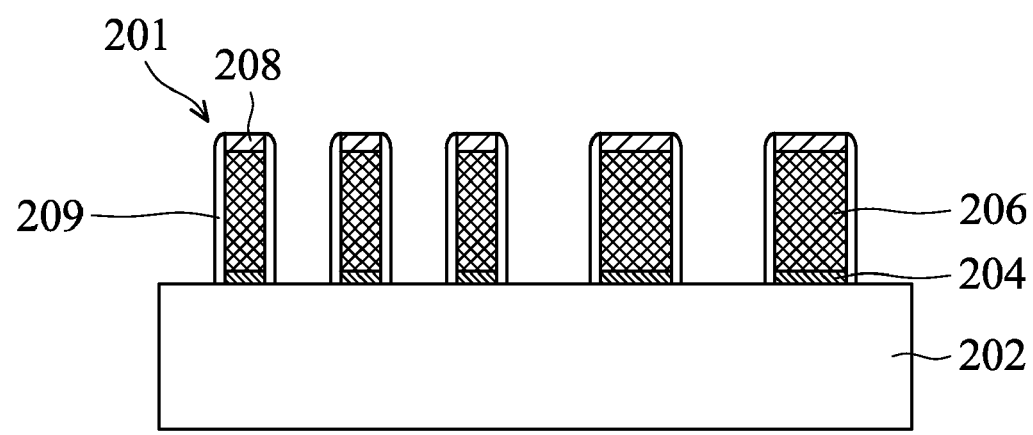
FIG. 10 shows a cross section of a stage of a method for forming a semiconductor device of another embodiment of the invention.
Figure 11:
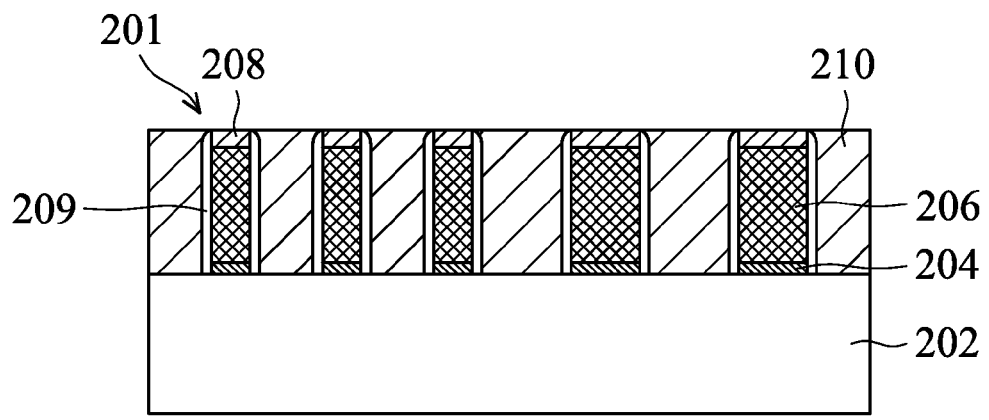
FIG. 11 shows a cross section of a stage of a method for forming a semiconductor device of another embodiment of the invention.
Figure 12:
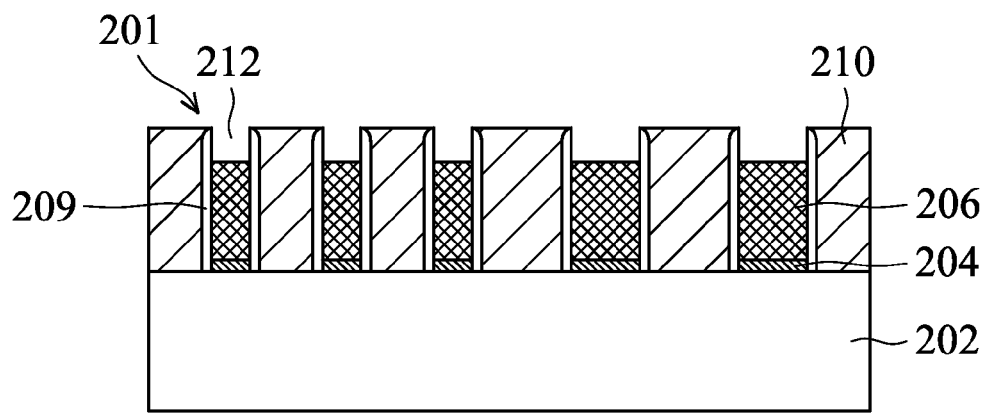
FIG. 12 shows a cross section of a stage of a method for forming a semiconductor device of another embodiment of the invention.
Figure 13:
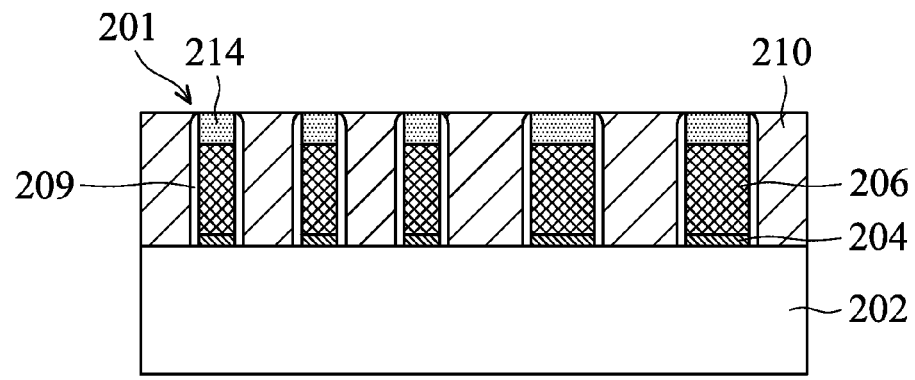
FIG. 13 shows a cross section of a stage of a method for forming a semiconductor device of another embodiment of the invention.

FIG. 9~FIG. 18B show various stages of a method to address step height issues when using a self-alignment method for forming a conductive contact of another embodiment of invention. First, referring to FIG. 9, a substrate 202 is provided. The substrate 202 may comprise silicon, gallium arsenide, gallium nitride, strained silicon, silicon germanium, silicon carbide, diamond, an epitaxy layer, and/or other materials. In a preferred embodiment of the invention, the substrate 202 is formed of silicon. A gate dielectric layer 204 is formed on the substrate 202. The gate dielectric layer 204 may comprise silicon oxide, silicon nitride, silicon oxynitride, or high dielectric constant materials, such as $Ta_2O_5$, $HfO_2$, $HSiO_x$, $Al_2O_3$, $InO_2$, $La_2O_3$, $ZrO_2$, and $TaO_2$. Next, a gate electrode layer 206 is formed on the gate dielectric layer 204. The gate electrode layer 206 can be poly or metal, such as tungsten. Thereafter, a cap layer 208 is formed on the gate electrode layer 206. In an embodiment of the invention, the cap layer 208 can be formed of silicon nitride. Referring to FIG. 10, the gate dielectric layer 204, the gate electrode layer 206 and the cap layer 208 are patterned by lithography and etching to form gates 201, and spacers 209, for example formed of TEOS, and spacers 209 are formed on sidewalls of the gates 201. Referring to FIG. 11, an insulating layer 210 is deposited to fill the space between the gates 201. In an embodiment of the invention, the insulating layer 210 can be BPSG, PSG, or USG. Referring to FIG. 12, a selective etching process is performed to remove the cap layer 208, and then a further etching process is performed to etch the gate electrode layer 206 to form first openings 212. Referring to FIG. 13, a buffer layer 214 is deposited to fill the first opening 212, and a method for etching back the buffer layer 214 is performed until the insulating layer 210 is exposed.

Figure 14A:
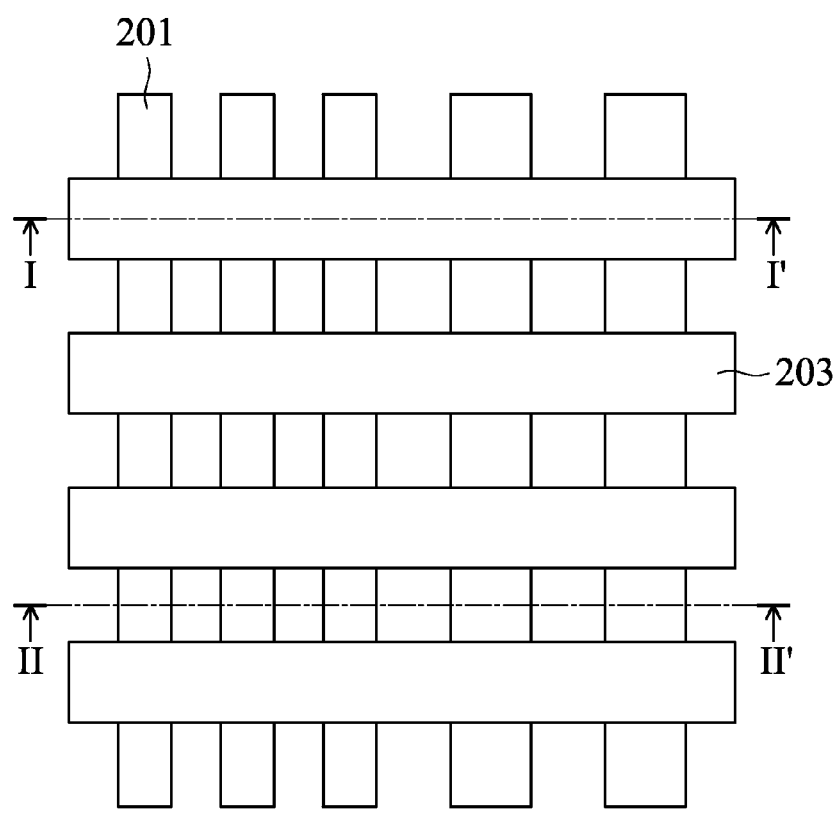
FIG. 14A shows a top view of a stage of a method for forming a semiconductor device of another embodiment of the invention.
Figure 14B:
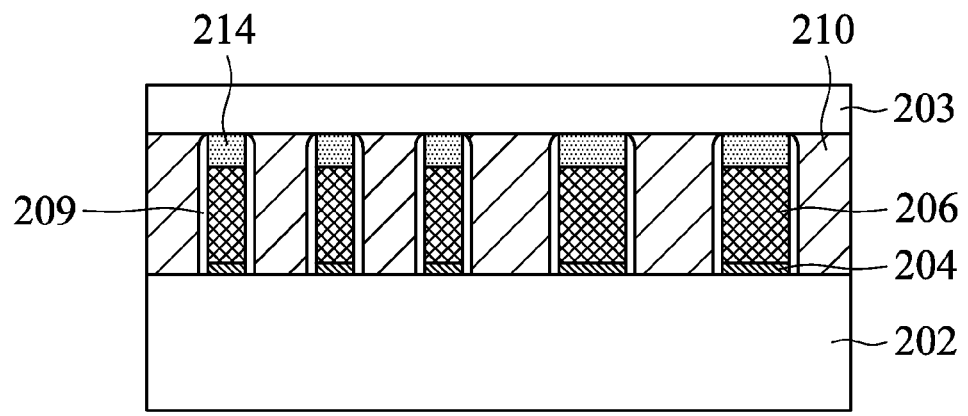
FIG. 14B shows a cross section along line I-I' of FIG. 14A.
Figure 14C:
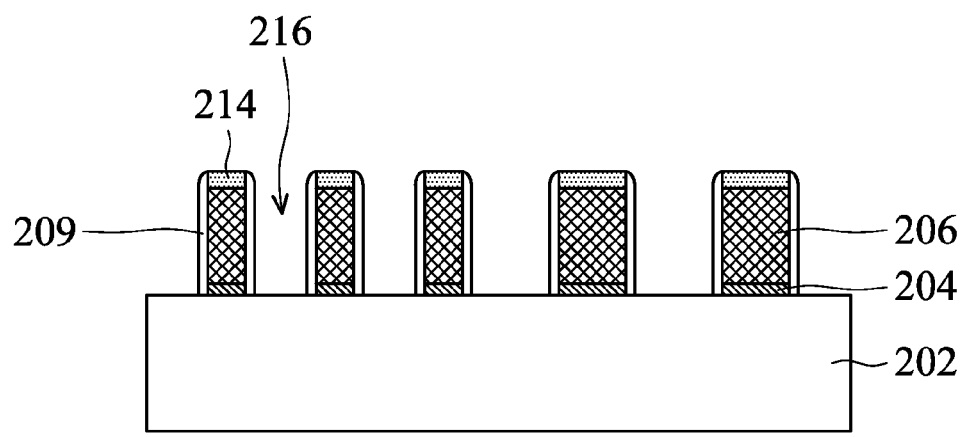
FIG. 14C shows a cross section along line II-II' of FIG. 14A.
Figure 15A:
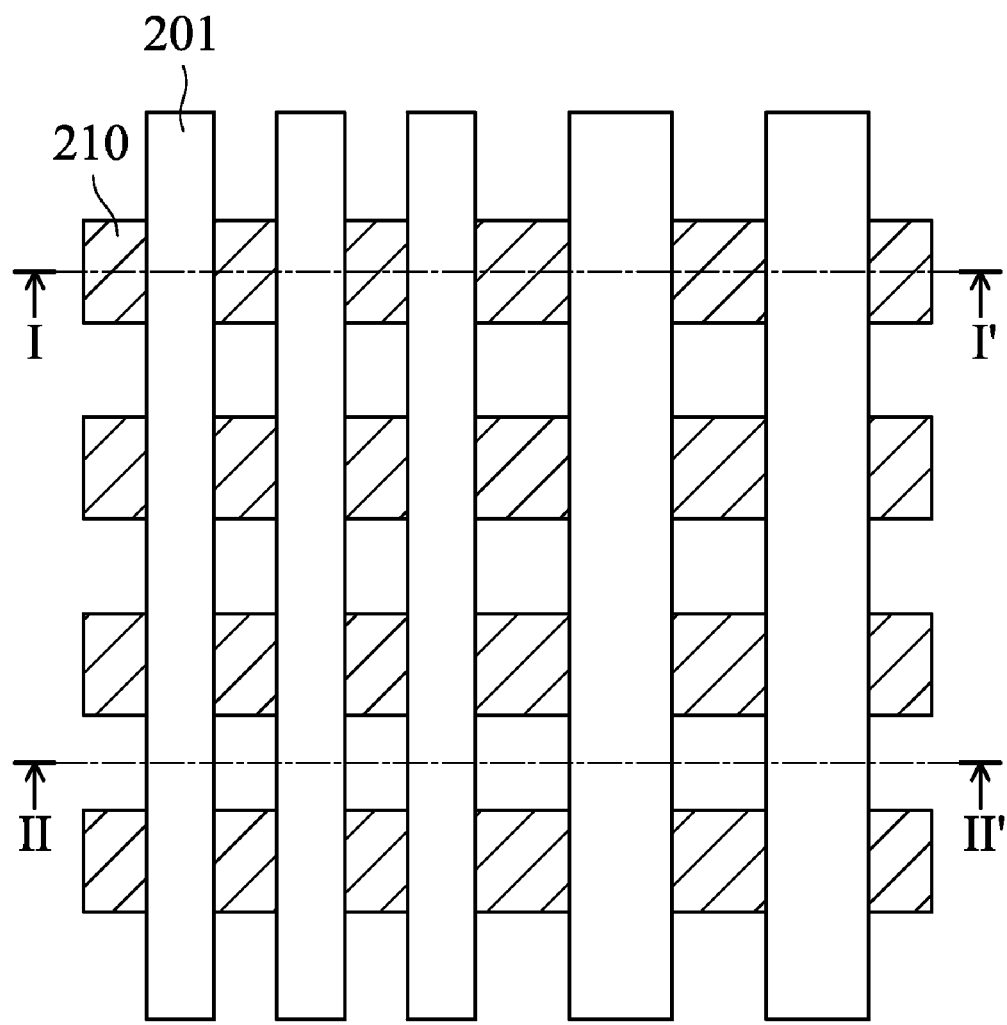
FIG. 15A shows a top view of a stage of a method for forming a semiconductor device of another embodiment of the invention.
Figure 15B:
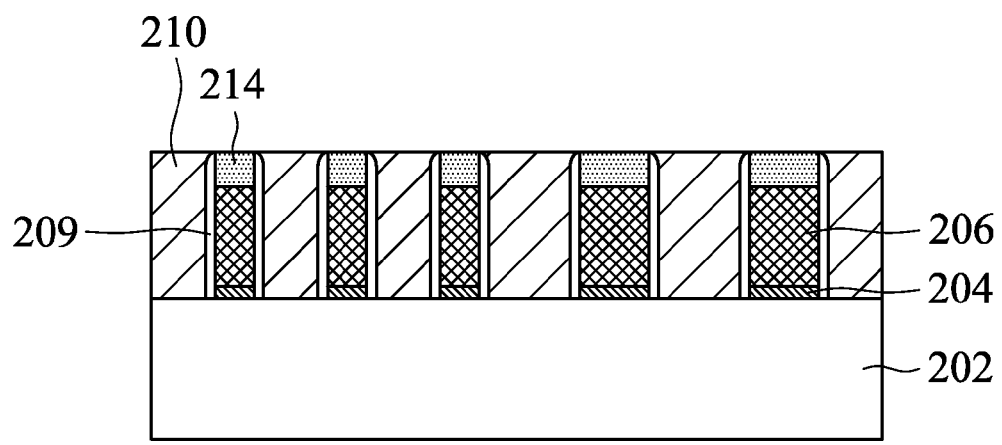
FIG. 15B shows a cross section along line I-I' of FIG. 15A.
Figure 15C:
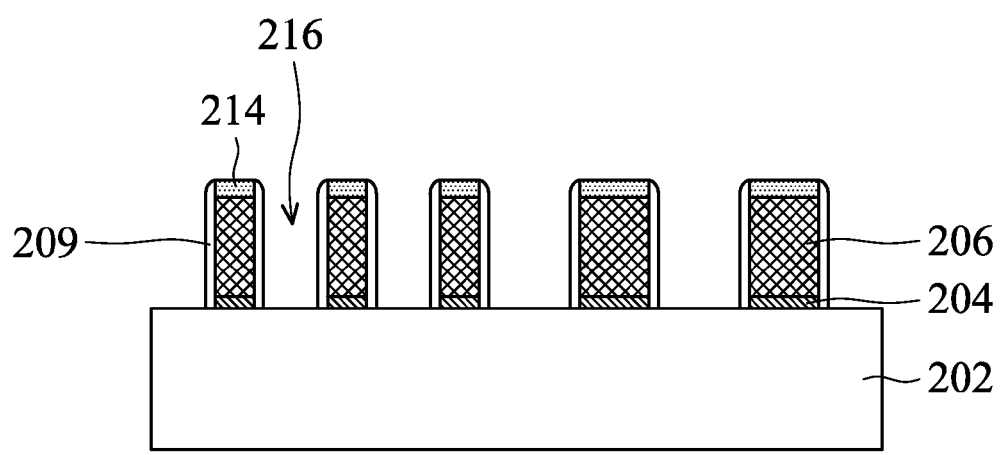
FIG. 15C shows a cross section along line II-II' of FIG. 15A.
Figure 16A:
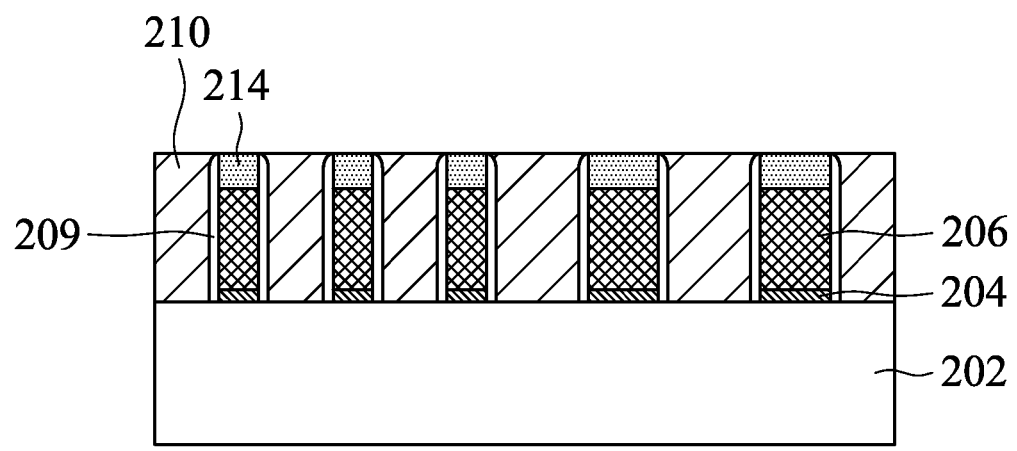
FIG. 16A shows a cross section of a next stage of the step of FIG. 15B.
Figure 16B:
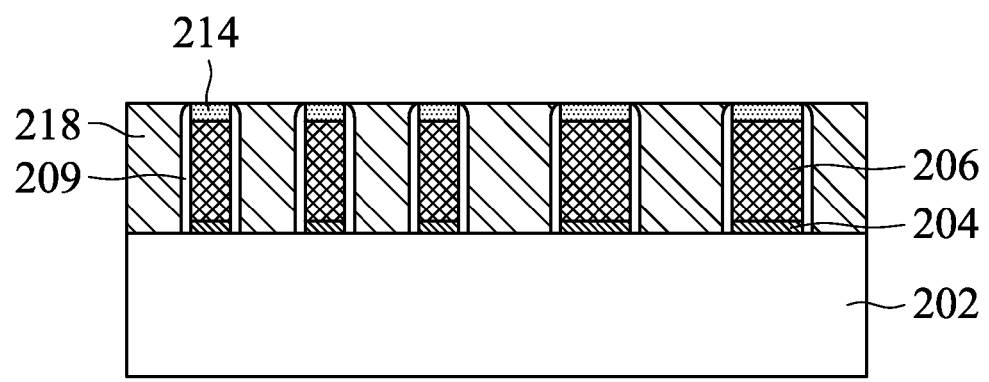
FIG. 16B shows a cross section of a next stage of the step of FIG. 15C.
Figure 17A:
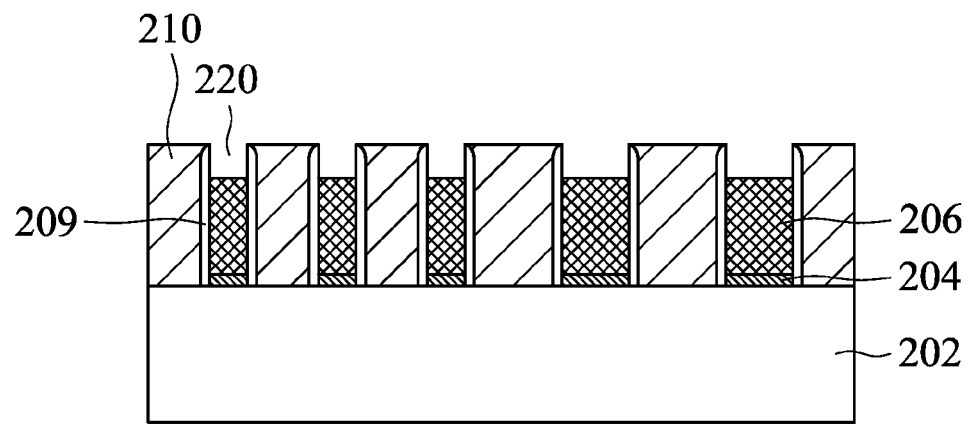
FIG. 17A shows a cross section of a next stage of the step of FIG. 16A.
Figure 17B:
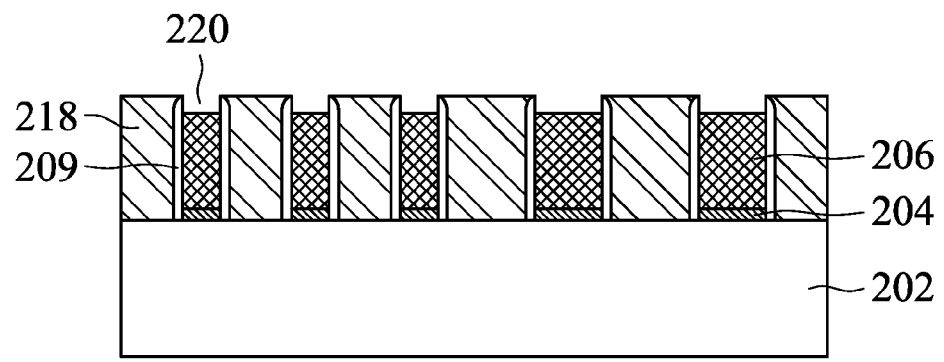
FIG. 17B shows a cross section of a next stage of the step of FIG. 16B.
Figure 18A:
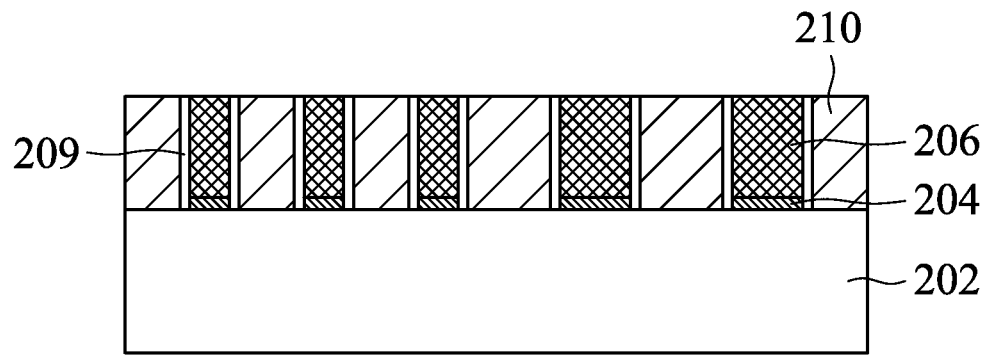
FIG. 18A shows a cross section of a next stage of the step of FIG. 17A.
Figure 18B:
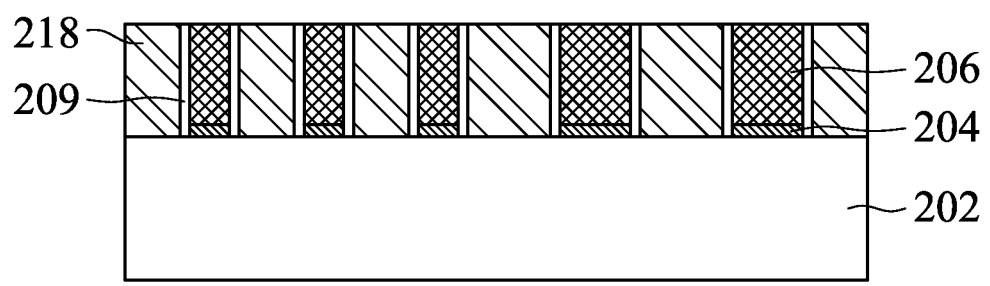
FIG. 18B shows a cross section of a next stage of the step of FIG. 17B.

Referring to FIG. 14A, FIG. 14B and FIG. 14C, wherein FIG. 14A shows a top view of a stage of a method for forming a semiconductor device, FIG. 14B shows a cross section along line I-I' of FIG. 14A, and FIG. 14C shows a cross section along line II-II' of FIG. 14A, a lithography process is performed to form a plurality of strip-shaped photoresist patterns 203 on the gates 201 and the insulating layer 210. Thereafter, a self-aligned etching process is performed to etch the insulating layer 210 using the gates 201 and the strip-shaped photoresist patterns 203 as an etching mask to form second openings 216. Referring to FIG. 15A, FIG. 15B and FIG. 15C, wherein FIG. 14A shows a top view of a stage of a method for forming a semiconductor device, FIG. 15B shows a cross section along line I-I' of FIG. 15A, and FIG. 15B shows a cross section along line II-II' of FIG. 15A, Next, the strip-shaped photoresist patterns 203 are removed. In an embodiment of the invention, the strip-shaped photoresist patterns 203 can be removed by ashing. It is noted that since a portion of the buffer layer 214 is covered by the strip-shaped photoresist patterns 203 during a self-aligned etching process, the potions of the buffer layer 214 in FIG. 15B have a greater thickness than the potions of the buffer layer 214 in FIG. 15C. However, the gate electrode layer 206 in FIG. 15B substantially has the same thickness as the gate electrode layer 206 in FIG. 15C. That is, portions of the buffer layer 214 under the strip-shaped photoresist patterns 203 are not etched, and the buffer layer 214 uncovered by the strip-shaped photoresist patterns 203 is etched during a self-aligned etching process, so that portions of the buffer layer 214 covered by the strip-shaped photoresist patterns 203 have a greater thickness than portions of the buffer layer 214 uncovered by the strip-shaped photoresist patterns 203. Referring to FIG. 16A, and FIG. 16B, wherein FIG. 16A shows a cross section of a next stage of the step of FIG. 15B, and FIG. 16B shows a cross section of a next stage of the step of FIG. 15C, a conductive contact layer 218 is deposited to fill the second openings 216. In an embodiment of the invention, the conductive contact layer 218 is polysilicon. Next, the conductive contact layer 218 is polished by a first CMP process to remove portions of the conductive contact layer 218 to have a flat surface and expose the buffer layer 214. Referring to FIG. 17A, and FIG. 17B, wherein FIG. 17A shows a cross section of a next stage of the step of FIG. 16A, and FIG. 17B shows a cross section of a next stage of the step of FIG. 16B, the buffer layer 214 is removed to form third openings 220. In an embodiment when the buffer layer 214 is silicon nitride, a wet etching process, such as immersion in phosphoric acid can remove the buffer layer 214. Referring to FIG. 18A, and FIG. 18B, wherein FIG. 18A shows a cross section of a next stage of the step of FIG. 17A, and FIG. 18B shows a cross section of a next stage of the step of FIG. 17B, a second CMP process is performed for the gate (including the gate dielectric layer 204 and the gate electrode layer 206) substantially having the same height as the conductive contact layer 218. As shown in FIG. 18B, a surface of the gate electrode layer 206 and a surface of the conductive contact layer 218 are substantially coplanar after performing of the second chemical mechanical polish (CMP) process. The process of FIG. 9~FIG. 18B can be called a "buffer layer 214 after the insulating material CMP process" because the buffer layer 214 is formed after chemical mechanical polishing the insulating layer 210.

The methods for forming the semiconductor process of embodiments of the invention have features as follows. First, step-height issues between the poly gate and poly contact from the self-alignment etching process can be addressed. Second, the polysilicon CMP process window can be improved.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. Method for forming a contact of a semiconductor device with reduced step height, comprising:
   forming a plurality of gates;
   forming a buffer layer on each of the gates;
   forming an insulating layer to fill spaces between the gates;
   forming strip-shaped photoresist patterns which cross the gates;
   etching the insulating layer to form first openings using a self-aligning process with the gates and the strip-shaped photoresist patterns as a mask;
   forming a conductive contact layer to fill the first openings;
   performing a first chemical mechanical polish (CMP) process to the conductive contact layer;
   removing the buffer layer; and
   performing a second chemical mechanical polish (CMP) process to the conductive contact layer.

2. The method for forming a contact of a semiconductor device with reduced step height as claimed in claim 1, wherein each of the gates comprises a gate dielectric layer on a substrate, a gate electrode layer on the gate dielectric layer and a cap layer on the gate electrode layer.

3. The method for forming a contact of a semiconductor device with reduced step height as claimed in claim 1, wherein forming the gates and the buffer layer comprise:
   providing a substrate;
   forming a gate dielectric layer on the substrate;
   forming a gate electrode layer on the gate dielectric layer;
   forming a cap layer on the gate electrode layer;
   forming a buffer layer on the cap layer; and
   patterning the gate dielectric layer, the gate electrode layer, the cap layer and the buffer layer.

4. The method for forming a contact of a semiconductor device with reduced step height as claimed in claim 1, wherein forming the gates and the buffer layer comprise:
   providing a substrate;
   forming a gate dielectric layer on the substrate;
   forming a gate electrode layer on the gate dielectric layer;
   forming a cap layer on the gate electrode layer;
   patterning the gate dielectric layer, the gate electrode layer and the cap layer to form the gates;
   forming an insulating layer into spaces between the gates;
   performing a CMP process to the insulating layer until the cap layer is exposed;

removing the cap layer and etching the gate electrode layer to form openings; and forming a buffer layer to fill the openings.

5. The method for forming a contact of a semiconductor device with reduced step height as claimed in claim 1, wherein the buffer layer is formed of carbon, silicon nitride or silicon oxide.

6. The method for forming a contact of a semiconductor device with reduced step height as claimed in claim 1, wherein the conductive contact layer is formed of polysilicon.

7. The method for forming a contact of a semiconductor device with reduced step height as claimed in claim 1, wherein the gate electrode is formed of polysilicon.

8. The method for forming a contact of a semiconductor device with reduced step height as claimed in claim 1, wherein the gate and conductive contact layer substantially have the same height after performing of the second chemical mechanical polish (CMP) process.

9. The method for forming a contact of a semiconductor device with reduced step height as claimed in claim 1, wherein a surface of the cap layer and a surface of the conductive contact layer are substantially coplanar after performing of the second chemical mechanical polish (CMP) process.

10. The method for forming a semiconductor device as claimed in claim 1, wherein a surface of the gate electrode layer and a surface of the conductive contact layer are substantially coplanar after performing of the second chemical mechanical polish (CMP) process.

11. A method for forming a semiconductor device, comprising:

forming a plurality of gates;
forming a buffer layer on each of the gates;
forming an insulating layer to fill spaces between the gates;
forming strip-shaped photoresist patterns which cross the gates;
etching the insulating layer to form first openings using a self-aligning process with the gates and the strip-shaped photoresist patterns as a mask, wherein portions of the buffer layer under the strip-shaped photoresist patterns are not etched, and the buffer layer uncovered by the strip-shaped photoresist patterns is etched during the self-aligned etching process, so that portions of the buffer layer covered by the strip-shaped photoresist patterns have a greater thickness than portions of the buffer layer uncovered by the strip-shaped photoresist patterns after etching the insulating layer using the self-aligning process;
forming a conductive contact layer to fill the first openings;
performing a first chemical mechanical polish (CMP) process to the conductive contact layer;
removing the buffer layer; and
performing a second chemical mechanical polish (CMP) process to the conductive contact layer, wherein the gate and conductive contact layer substantially have the same height after performing of the second chemical mechanical polish (CMP) process.

12. The method for forming a semiconductor device as claimed in claim 11, wherein forming the gates and the buffer layer comprise:

providing a substrate;
forming a gate dielectric layer on the substrate;
forming a gate electrode layer on the gate dielectric layer;
forming a cap layer on the gate electrode layer;
forming a buffer layer on the cap layer; and
patterning the gate dielectric layer, the gate electrode layer, the cap layer and the buffer layer.

13. The method for forming a semiconductor device as claimed in claim 11, wherein forming the gates and the buffer layer comprise:

providing a substrate;
forming a gate dielectric layer on the substrate;
forming a gate electrode layer on the gate dielectric layer;
forming a cap layer on the gate electrode layer;
patterning the gate dielectric layer, the gate electrode layer and the cap layer to form the gates;
forming an insulating layer into spaces between the gates;
performing a CMP process to the insulating layer until the cap layer is exposed;
removing the cap layer and etching the gate electrode layer to form openings;
forming a buffer layer to fill the openings; and
etching back the buffer layer.

14. The method for forming a semiconductor device as claimed in claim 11, wherein the buffer layer is formed of carbon, silicon nitride or silicon oxide.

15. The method for forming a semiconductor device as claimed in claim 11, wherein the conductive contact layer is formed of polysilicon.

16. The method for forming a semiconductor device as claimed in claim 11, wherein a surface of the cap layer and a surface of the conductive contact layer are substantially coplanar after performing of the second chemical mechanical polish (CMP) process.

17. The method for forming a semiconductor device as claimed in claim 11, wherein a surface of the gate electrode layer and a surface of the conductive contact layer are substantially coplanar after performing of the second chemical mechanical polish (CMP) process.

18. The method for forming a semiconductor device as claimed in claim 11, wherein the gate electrode layer is formed of polysilicon.

* * * * *